(12) United States Patent
Ando et al.

(10) Patent No.: US 11,495,669 B2
(45) Date of Patent: Nov. 8, 2022

(54) FULL AIR-GAP SPACERS FOR GATE-ALL-AROUND NANOSHEET FIELD EFFECT TRANSISTORS

(71) Applicant: INTERNATIONAL BUSINESS MACHINES CORPORATION, Armonk, NY (US)

(72) Inventors: Takashi Ando, Tuckahoe, NY (US); Pouya Hashemi, White Plains, NY (US); Choonghyun Lee, Rensselaer, NY (US); Alexander Reznicek, Troy, NY (US); Jingyun Zhang, Albany, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 320 days.

(21) Appl. No.: 16/703,188

(22) Filed: Dec. 4, 2019

(65) Prior Publication Data

US 2020/0105896 A1   Apr. 2, 2020

Related U.S. Application Data

(62) Division of application No. 15/819,708, filed on Nov. 21, 2017, now Pat. No. 10,553,696.

(51) Int. Cl.
*H01L 29/49*   (2006.01)
*H01L 29/06*   (2006.01)
(Continued)

(52) U.S. Cl.
CPC .... *H01L 29/4991* (2013.01); *H01L 21/02603* (2013.01); *H01L 21/28123* (2013.01);
(Continued)

(58) Field of Classification Search
CPC ........... H01L 29/4991; H01L 21/02603; H01L 21/764; H01L 21/7682; H01L 21/823864;
(Continued)

(56) References Cited

U.S. PATENT DOCUMENTS 10,553,696 B2   2/2020   Ando et al.
2017/0110554 A1*  4/2017   Tak ..................... H01L 29/4991
(Continued)

OTHER PUBLICATIONS

List of IBM Patents or Patent Applications Treated as Related dated Dec. 4, 2019, 2 pages.
(Continued)

*Primary Examiner* — Matthew C Landau
*Assistant Examiner* — Mark Hatzilambrou
(74) *Attorney, Agent, or Firm* — Tutunjian & Bitetto, P.C.; Samuel Waldbaum

(57) ABSTRACT

Semiconductor devices include a stack of vertically arranged channel layers. A gate stack is formed above, between, and around the vertically arranged channel layers. Source and drain regions and source and drain conductive contacts are formed. Inner spacers are formed between the vertically arranged channel layers, each having an inner air gap and a recessed layer formed from a first dielectric material. Outer spacers are formed between the gate stack and the source and drain conductive contacts, each having a second dielectric material that is pinched off to form an outer air gap.

20 Claims, 7 Drawing Sheets

(51) Int. Cl.
*H01L 29/423* (2006.01)
*H01L 29/786* (2006.01)
*H01L 21/768* (2006.01)
*H01L 29/66* (2006.01)
*H01L 27/092* (2006.01)
*H01L 21/8238* (2006.01)
*H01L 21/02* (2006.01)
*H01L 21/28* (2006.01)
*H01L 21/764* (2006.01)
*H01L 21/84* (2006.01)
*H01L 29/775* (2006.01)

(52) U.S. Cl.
CPC ........ *H01L 21/764* (2013.01); *H01L 21/7682* (2013.01); *H01L 21/76895* (2013.01); *H01L 21/823807* (2013.01); *H01L 21/823814* (2013.01); *H01L 21/823864* (2013.01); *H01L 21/823878* (2013.01); *H01L 21/84* (2013.01); *H01L 27/092* (2013.01); *H01L 29/0673* (2013.01); *H01L 29/42392* (2013.01); *H01L 29/66439* (2013.01); *H01L 29/66545* (2013.01); *H01L 29/66772* (2013.01); *H01L 29/775* (2013.01); *H01L 29/78618* (2013.01); *H01L 29/78654* (2013.01); *H01L 29/78696* (2013.01)

(58) Field of Classification Search
CPC ........... H01L 29/0673; H01L 29/42392; H01L 29/78696
See application file for complete search history.

(56) References Cited

U.S. PATENT DOCUMENTS

2017/0141207 A1* 5/2017 Cheng ................. H01L 21/0259
2017/0294537 A1* 10/2017 Cheng ............... H01L 29/66742
2018/0254321 A1* 9/2018 Wostyn ........... H01L 21/823425

OTHER PUBLICATIONS

U.S. Office Action issued in U.S. Appl. No. 16/703,085 dated Dec. 21, 2021, pp. 1-13.

* cited by examiner

FULL AIR-GAP SPACERS FOR GATE-ALL-AROUND NANOSHEET FIELD EFFECT TRANSISTORS

BACKGROUND

Technical Field

The present invention generally relates to nanosheet field effect transistors and, more particularly, to the use of air-gap inner and outer spacers in such transistors.

Description of the Related Art

One design challenge in the fabrication of gate-all-around nanosheet field effect transistors (FETs) is the reduction of parasitic capacitance between gate and source/drain regions. Parasitic capacitance is of particular concern in alternating current applications, where reactive impedances can cause spurious oscillations.

Dielectric spacers are used to diminish parasitic capacitance, and air-gap spacers have particularly useful properties toward this end. However, conventional air-gap spacer formation relies on the non-conformal deposition of dielectric material and etch-back processes, which are difficult to control precisely and which lead to variation and non-uniformity in the air gaps.

SUMMARY

A semiconductor device includes a stack of vertically arranged channel layers. A gate stack is formed above, between, and around the vertically arranged channel layers. Source and drain regions and source and drain conductive contacts are formed. Inner spacers are formed between the vertically arranged channel layers, each having an inner air gap and a recessed layer formed from a first dielectric material. Outer spacers are formed between the gate stack and the source and drain conductive contacts, each having a second dielectric material that is pinched off to form an outer air gap.

A semiconductor device includes a stack of vertically arranged channel layers. A gate stack is formed above, between, and around the vertically arranged channel layers. Source and drain regions are grown from sidewalls of the vertically arranged channel layers. Source and drain conductive contacts are formed. Inner spacers are formed between the vertically arranged channel layers, each having an inner air gap and a recessed layer formed from a first dielectric material. Each recessed layer contacts the gate stack and is recessed relative to sidewalls of the vertically arranged channel layers. Outer spacers are formed between the gate stack and the source and drain conductive contacts, each having a second dielectric material that is pinched off to form an outer air gap.

A semiconductor device includes a stack of vertically arranged channel layers. A gate stack is formed above, between, and around the vertically arranged channel layers. Source and drain regions are grown from sidewalls of the vertically arranged channel layers. Source and drain conductive contacts are formed. Inner spacers are formed between the vertically arranged channel layers, each having an inner air gap and a recessed layer formed from silicon nitride. Each recessed layer is formed conformally on surfaces of the gate stack and the vertically arranged channel layers and is recessed relative to sidewalls of the vertically arranged channel layers. Outer spacers are formed between the gate stack and the source and drain conductive contacts, each having a silicoboron carbonitride layer that is formed conformally on sides of the source and drain conductive contacts and is pinched off to form an outer air gap.

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein.

DETAILED DESCRIPTION

Embodiments of the present invention use dual-layer spacers during fabrication and exploit etch selectivity between the two layers to create consistent, uniform inner and outer air-gap spacers in nanosheet field effect transistors (FETs).

Figure 1:
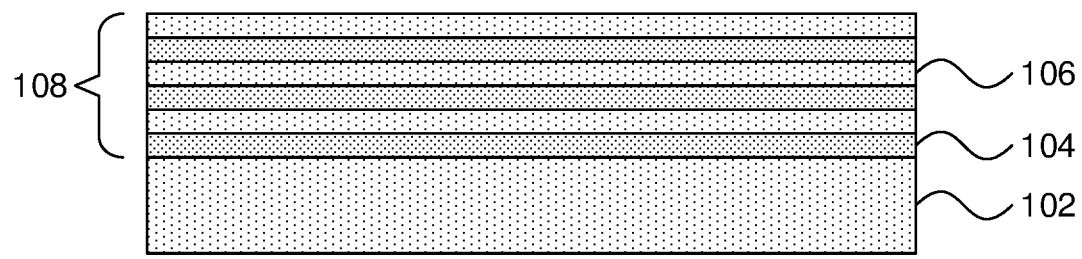
FIG. 1 is a cross sectional diagram of a step in forming nanosheet field effect transistors (FETs) with air-gap inner and outer spacers, showing a stack of sacrificial layers and channel layers, in accordance with an embodiment of the present invention.

Referring now to the drawings in which like numerals represent the same or similar elements and initially to FIG. 1, a cross-sectional diagram of a step in forming nanosheet FETs with air-gap inner and outer spacers is shown. A semiconductor substrate 102 is provided. The semiconductor substrate 102 may be a bulk-semiconductor substrate. In one example, the bulk-semiconductor substrate may be a silicon-containing material. Illustrative examples of silicon-containing materials suitable for the bulk-semiconductor substrate include, but are not limited to, silicon, silicon germanium, silicon germanium carbide, silicon carbide, polysilicon, epitaxial silicon, amorphous silicon, and multi-layers thereof. Although silicon is the predominantly used semiconductor material in wafer fabrication, alternative semiconductor materials can be employed, such as, but not limited to, germanium, gallium arsenide, gallium nitride, cadmium telluride, and zinc selenide. Although not depicted herein, the semiconductor substrate 102 may also be a semiconductor on insulator (SOI) substrate.

A stack of alternating semiconductor layers 108 is formed on the semiconductor substrate 102. Layers of a sacrificial material 104 alternate with layers of a channel material 106. The sacrificial layers 104 may have an exemplary thickness of about 9 nm and the channel layers 106 may have an exemplary thickness of about 8 nm. The sacrificial layers 104 and the channel layers 106 have etch selectivity with respect to one another. As used herein, the term "selective" in reference to a material removal process denotes that the rate of material removal for a first material is greater than the rate of removal for at least another material of the structure to which the material removal process is being applied. In one specific embodiment, etch selectivity denotes a ratio of etch rates between an etched material and other materials of at least 10:1.

In one specific embodiment, the layers of sacrificial material are formed from silicon germanium and the layers of channel material are formed from silicon. These two materials have etch selectivity with respect to one another, such that the material of one set of layers can be removed without substantially affecting the material of the other layers. In addition, silicon and silicon germanium have generally compatible crystalline structures. It should be understood, however, that any appropriate combination of semiconductor materials having etch selectivity with respect to one another and compatible crystalline structures may be used instead.

The stack of alternating semiconductor layers 108 may be formed by any appropriate deposition process, including for example chemical vapor deposition (CVD), atomic layer deposition (CVD), physical vapor deposition (PVD), and gas cluster ion beam (GCIB) deposition. CVD is a deposition process in which a deposited species is formed as a result of chemical reaction between gaseous reactants at greater than room temperature (e.g., from about 25° C. about 900° C.). The solid product of the reaction is deposited on the surface on which a film, coating, or layer of the solid product is to be formed. Variations of CVD processes include, but are not limited to, Atmospheric Pressure CVD (APCVD), Low Pressure CVD (LPCVD), Plasma Enhanced CVD (PECVD), and Metal-Organic CVD (MOCVD) and combinations thereof may also be employed. In alternative embodiments that use PVD, a sputtering apparatus may include direct-current diode systems, radio frequency sputtering, magnetron sputtering, or ionized metal plasma sputtering. In alternative embodiments that use ALD, chemical precursors react with the surface of a material one at a time to deposit a thin film on the surface. In alternative embodiments that use GCIB deposition, a high-pressure gas is allowed to expand in a vacuum, subsequently condensing into clusters. The clusters can be ionized and directed onto a surface, providing a highly anisotropic deposition.

Figure 2:
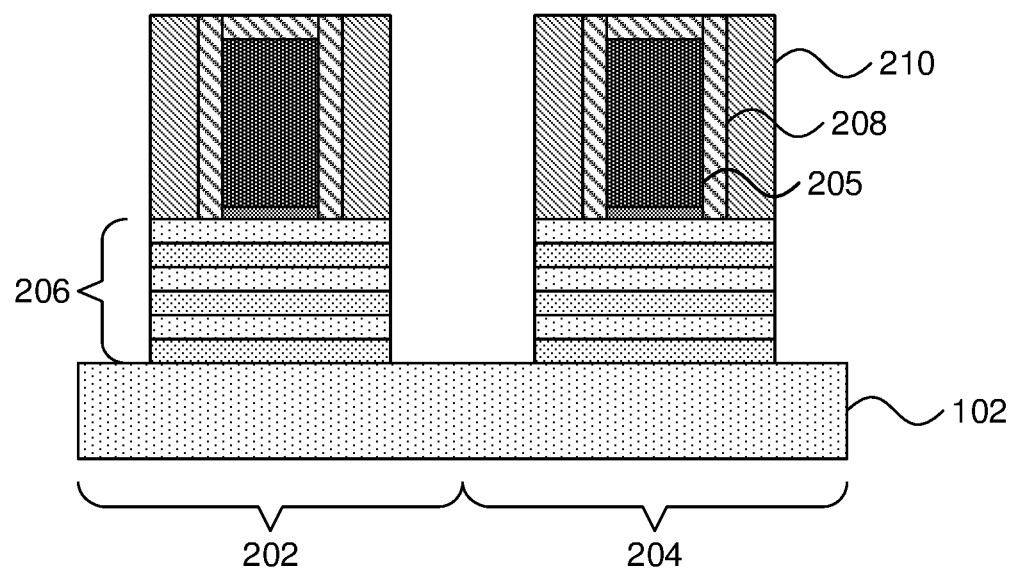
FIG. 2 is a cross sectional diagram of a step in forming nanosheet FETs with air-gap inner and outer spacers, showing etching of the stack using a dummy gate as a mask, in accordance with an embodiment of the present invention.

Referring now to FIG. 2, a cross-sectional diagram of a step in forming nanosheet FETs with air-gap inner and outer spacers is shown. The figure depicts a first region 202 and a second region 204, which may in some embodiments represent devices having different properties (e.g., with one region being an n-type FET and the other region being a p-type FET). It should be understood that these two regions are formed on a single wafer and may be separated by a substantial distance. Dummy gates 205 are formed in the respective regions and may be formed from any appropriate material such as, e.g., polysilicon or amorphous silicon. The dummy gates 205 are surrounded by a dual-layer spacer that includes a first spacer layer 208 formed from, e.g., silicon nitride, and a second spacer layer 210 formed from, e.g., silicon dioxide. Although these materials are specifically contemplated, it should be understood that any appropriate material may be used instead as long as etch selectivity is maintained between the first spacer layer 208 and the second spacer layer 210.

The dummy gates 205 may be formed by depositing a dielectric hard mask material, such as silicon nitride or silicon dioxide, on a layer of dummy gate material and then applying a photoresist pattern to the hard mask material using a lithography process. The photoresist pattern is then transferred into the hard mask material using, e.g., a dry etch process to form a gate pattern hardmask. Next, the photoresist pattern is removed and the gate pattern is then transferred into the dummy gate material during an anisotropic selective etching process, such as reactive ion etching (RIE). Alternatively, the dummy gates 205 can be formed by other patterning techniques such as spacer image transfer.

RIE is a form of plasma etching in which during etching the surface to be etched is placed on a radio-frequency powered electrode. During RIE the surface to be etched takes on a potential that accelerates the etching species extracted from plasma toward the surface, in which the chemical etching reaction is taking place in the direction normal to the surface. Other examples of anisotropic etching that can be used at this point of the present invention include ion beam etching, plasma etching or laser ablation.

An anisotropic etch is applied that stops on the substrate 102. The anisotropic etch should remove material from the spacer 208, such that it can penetrate to the underlying stack of layers 108, but should etch the stack of semiconductor layers 108 at a rate greater than the rate at which it etches the spacer layers 208 and 210.

It is specifically contemplated that RIE may be used to perform the anisotropic etch. In one specific embodiment, multiple different etches may be used, with a first etch anisotropically removing material to remove material around the thicker gate pattern hardmask and vertical spacer, followed by a second etch that is selective to the materials of the stack 108 without affecting the remaining hardmask materials. What remains is etched channel stacks 206 in the first region 202 and second region 204, with the etched channel stacks 206 extending no farther than the second spacer layer 210.

The shape of the resulting stack 206 will determine whether the channel layers of the finished device will be nanosheets or nanowires, with nanosheets having a width-to-thickness ratio of at least about 2:1 and with nanowires having a width-to-thickness of less than about 2:1. Although nanosheet structures are predominately described herein, the present embodiments can be implemented with either nanosheets or nanowires.

Figure 3:
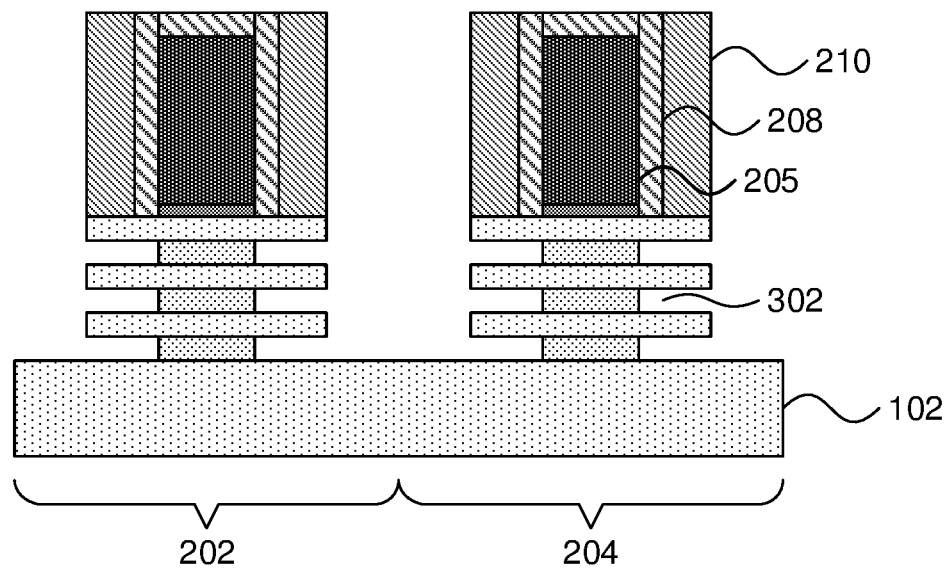
FIG. 3 is a cross sectional diagram of a step in forming nanosheet FETs with air-gap inner and outer spacers, showing recessing of the sacrificial layers, in accordance with an embodiment of the present invention.

Referring now to FIG. 3, a cross-sectional diagram of a step in forming nanosheet FETs with air-gap inner and outer spacers is shown. An isotropic etch is used to laterally etch the layers of sacrificial material 104. The etch selectively removes material from the layers of sacrificial material 104 and leaves the layers of channel material in place 106, creating etched sacrificial layers 302. In some embodiments, the layers of sacrificial material 104 may be etched back as far as the dummy gate 205.

Figure 4:
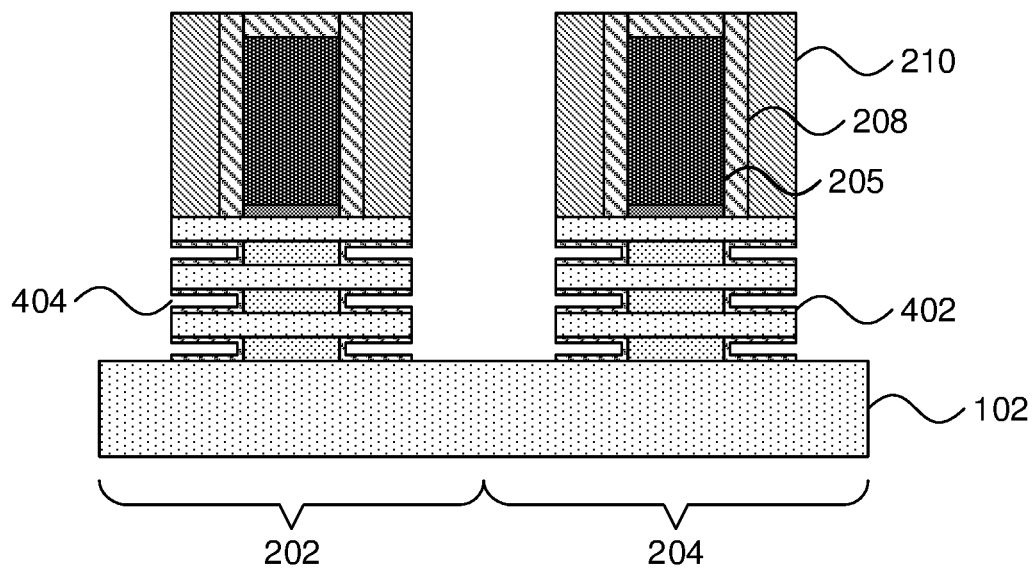
FIG. 4 is a cross sectional diagram of a step in forming nanosheet FETs with air-gap inner and outer spacers, showing formation of a first inner spacer layer, in accordance with an embodiment of the present invention.

Referring now to FIG. 4, a cross-sectional diagram of a step in forming nanosheet FETs with air-gap inner and outer spacers is shown. A first inner spacer layer 402 is formed in the spaces left by etched sacrificial layers 302. The first inner spacer layer 402 may be formed from, e.g., silicon nitride, by some conformal deposition process such as, e.g., CVD. An anisotropic etch, such as an appropriate RIE, may be used to remove the deposited material from unprotected surfaces.

The first inner spacer layer 402 is formed to a thickness that leaves a gap 404. Said thickness may, in some embodiments, be between about 1 nm and about 2 nm thick. The thickness of the first inner spacer layer 402 will therefore have a maximum value that is half of the thickness of the sacrificial layers 104.

Figure 5:
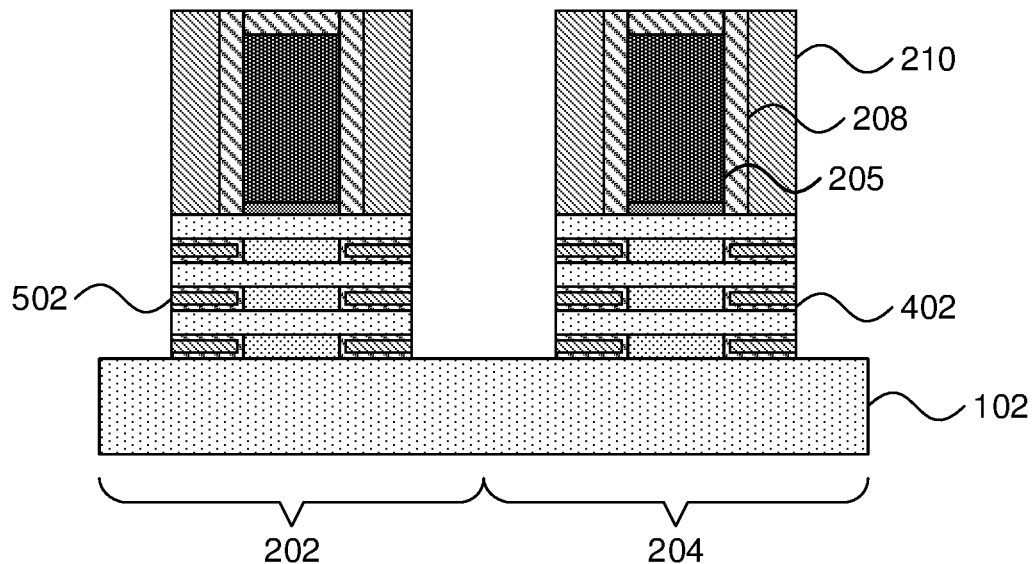
FIG. 5 is a cross sectional diagram of a step in forming nanosheet FETs with air-gap inner and outer spacers, showing formation of a second inner spacer layer, in accordance with an embodiment of the present invention.

Referring now to FIG. 5, a cross-sectional diagram of a step in forming nanosheet FETs with air-gap inner and outer spacers is shown. A second inner spacer layer 502 is conformally deposited to fill the remaining space and may be formed from, e.g., silicon dioxide. As with the first inner spacer layer 402, additional deposited material may be removed from exposed surfaces using, e.g., an anisotropic etch.

Regarding the etches to clean the exposed surfaces, it should be understood that the etches may be performed after depositing both spacer layers or may, as stated, be performed one at a time, immediately after the deposition of the respective spacer material.

Figure 6:
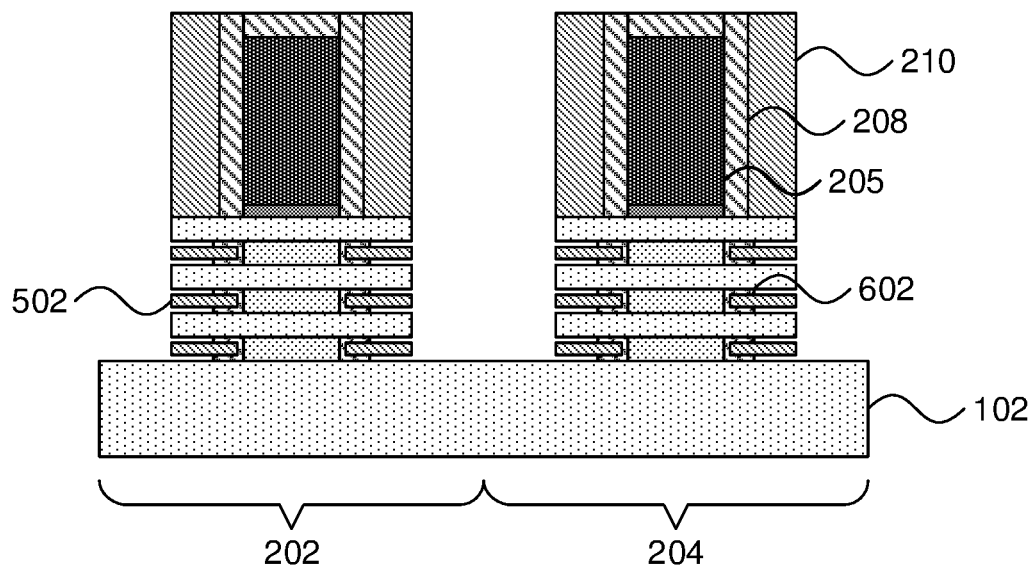
FIG. 6 is a cross sectional diagram of a step in forming nanosheet FETs with air-gap inner and outer spacers, showing recessing of the first inner spacer layer relative to the second inner spacer layer, in accordance with an embodiment of the present invention.

Referring now to FIG. 6, a cross-sectional diagram of a step in forming nanosheet FETs with air-gap inner and outer spacers is shown. An etch is performed to recess the first inner spacer layer 402, producing recessed first inner spacers 602. Any appropriate wet or dry chemical etch may be used to recess these structures. It should be understood that such an etch may also damage some of the structures of the gate stack/spacers, but that these structures may be made thick enough such that they are not consumed.

Figure 7:
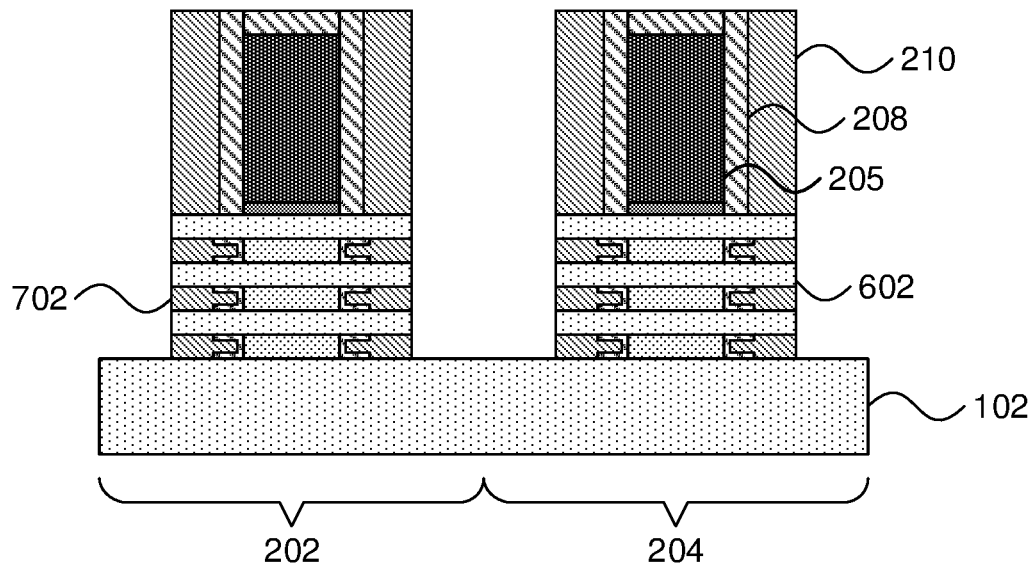
FIG. 7 is a cross sectional diagram of a step in forming nanosheet FETs with air-gap inner and outer spacers, showing expansion of the second inner spacer layer, in accordance with an embodiment of the present invention.

Referring now to FIG. 7, a cross-sectional diagram of a step in forming nanosheet FETs with air-gap inner and outer spacers is shown. Additional material (e.g., silicon dioxide) is conformally deposited to cause the second inner spacer layer 502 to fill in the gaps left by recessing the first inner spacer layer 602, producing expanded second inner spacer layers 702. This deposition may be performed using any appropriate conformal process such as, e.g., CVD.

It should be noted that, because of the narrow opening left by the recess of the first inner spacer layer 602, there may be imperfections in the expanded second inner spacer layers 702. However, because these structures will be etched away in subsequent processing steps, internal imperfections will not matter.

Figure 8:
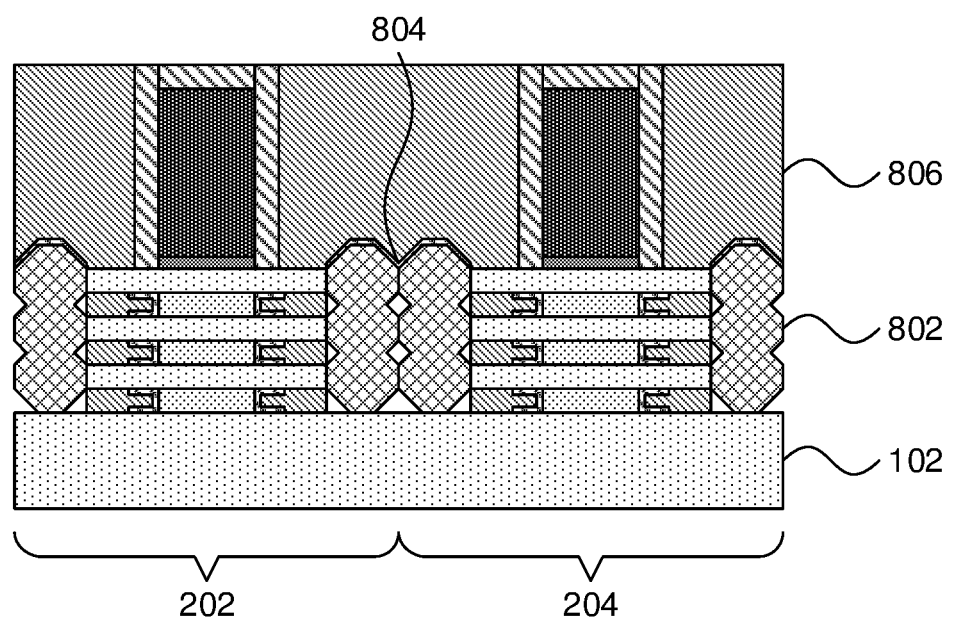
FIG. 8 is a cross sectional diagram of a step in forming nanosheet FETs with air-gap inner and outer spacers, showing formation of source and drain regions, in accordance with an embodiment of the present invention.

Referring now to FIG. 8, a cross-sectional diagram of a step in forming nanosheet FETs with air-gap inner and outer spacers is shown. Source/drain regions 802 are grown from the exposed ends of the layers of channel material 106. It is specifically contemplated that the source/drain regions 802 may be epitaxially grown from a same material as the layers of channel material 106 (e.g., silicon) and may be in situ doped. The second inner spacer layers 702 prevent the source/drain regions 802 from growing from the top and bottom surfaces of the channel layers 106.

The terms "epitaxial growth and/or deposition" means the growth of a semiconductor material on a deposition surface of a semiconductor material, in which the semiconductor material being grown has substantially the same crystalline characteristics as the semiconductor material of the deposition surface. The term "epitaxial material" denotes a material that is formed using epitaxial growth. In some embodiments, when the chemical reactants are controlled and the system parameters set correctly, the depositing atoms arrive at the deposition surface with sufficient energy to move around on the surface and orient themselves to the crystal arrangement of the atoms of the deposition surface. Thus, in some examples, an epitaxial film deposited on a {100} crystal surface will take on a {100} orientation.

A liner layer 804 of, e.g., silicon nitride, is conformally deposited over the source/drain regions 802. An encapsulating layer 806 is then deposited to protect the source/drain regions 802 and inner spacer layers from subsequent etches and may be formed by any appropriate deposition process including, e.g., CVD or a spin-on flowable oxide deposition. The encapsulating layer 806 may be formed from, e.g., silicon dioxide.

Figure 9:
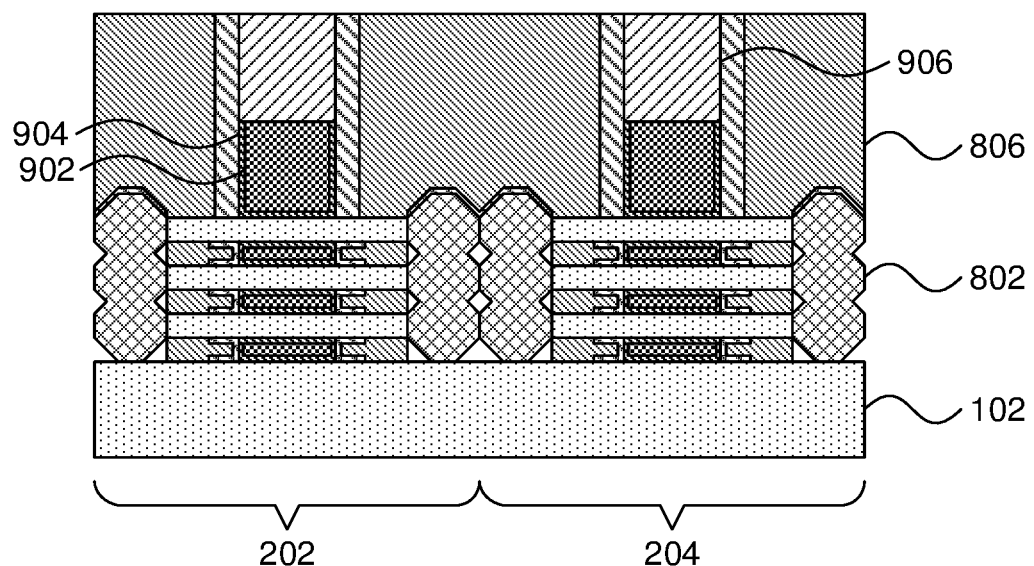
FIG. 9 is a cross sectional diagram of a step in forming nanosheet FETs with air-gap inner and outer spacers, showing replacement of the dummy gate, in accordance with an embodiment of the present invention.

Referring now to FIG. 9, a cross-sectional diagram of a step in forming nanosheet FETs with air-gap inner and outer spacers is shown. The dummy gate stack is removed by an appropriate etch and then the recessed sacrificial layers 302 are etched away as well, exposing the surfaces of the channel layers 106. A new gate stack is then deposited including, e.g., a gate dielectric layer 902 and a gate conductor 904. It is specifically contemplated that the gate dielectric layer 902 and the gate conductor 904 will form a "gate-all-around" structure, completely encircling the exposed portions of the channel layers 106. A self-aligned contact cap 906 is deposited over the gate conductor 904.

It is specifically contemplated that the gate dielectric 902 may be a high-k gate dielectric material, although other materials are also contemplated. A high-k dielectric material is a dielectric material having a dielectric constant greater than that of silicon dioxide and may include, for example, metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k dielectric material may further include dopants such as lanthanum and aluminum.

The gate conductor 904 may be formed from any appropriate conductive material including, for example, a metal or metallic conductive material including, e.g., tungsten, nickel, titanium, molybdenum, tantalum, copper, platinum, silver, gold, ruthenium, iridium, rhenium, rhodium, and alloys thereof. The gate conductor may alternatively include a doped semiconductor material such as, e.g., doped polysilicon. When a combination of conductive elements is employed, an optional diffusion barrier material such as tantalum nitride or tungsten nitride may be formed between the conductive materials.

Figure 10:
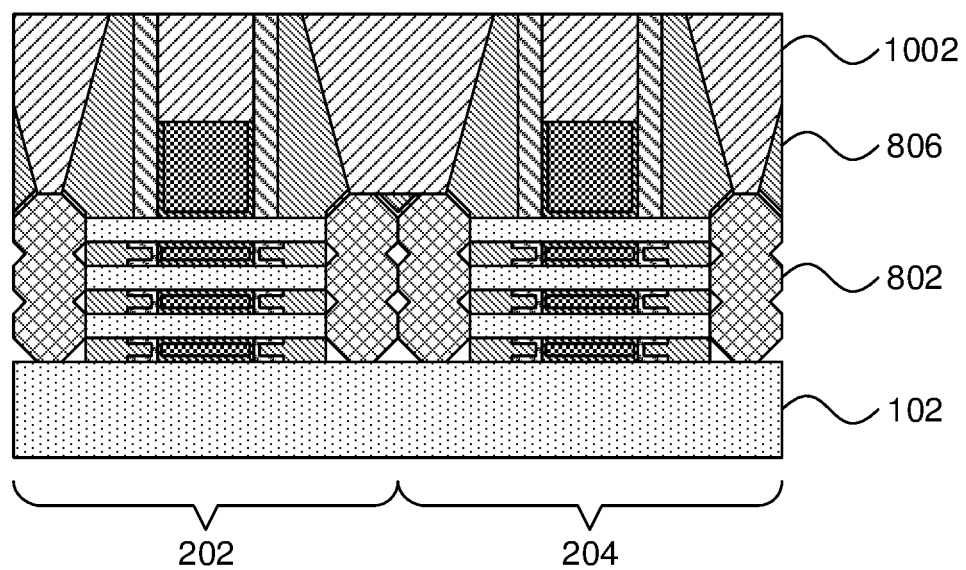
FIG. 10 is a cross sectional diagram of a step in forming nanosheet FETs with air-gap inner and outer spacers, showing formation of source and drain contacts, in accordance with an embodiment of the present invention.

Referring now to FIG. 10, a cross-sectional diagram of a step in forming nanosheet FETs with air-gap inner and outer spacers is shown. An anisotropic etch is performed to penetrate the encapsulating layer 806 and the liner layer 804 to reach the source/drain regions 802. Contacts 1002 are then formed in the resulting holes, providing electrical contact to the source/drain regions 802.

Figure 11:
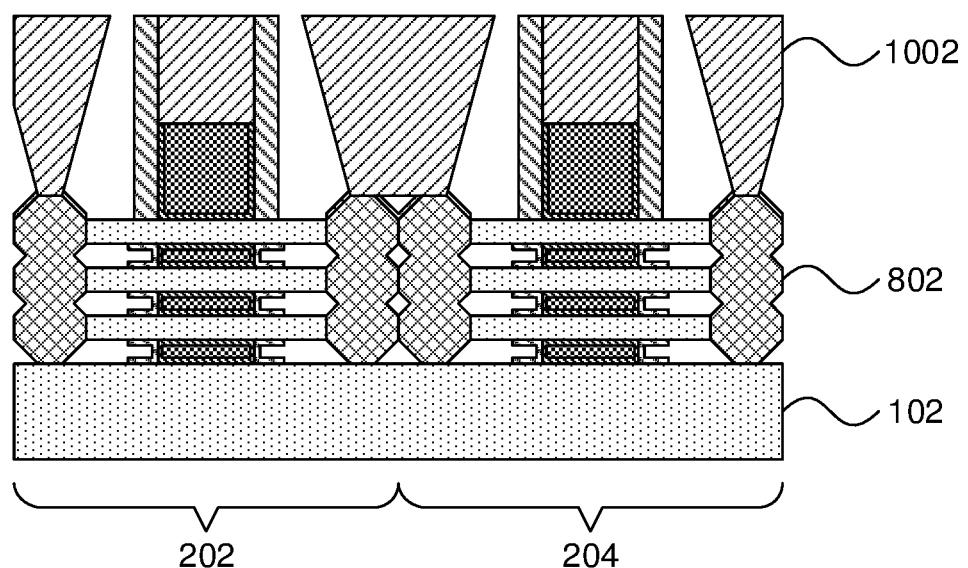
FIG. 11 is a cross sectional diagram of a step in forming nanosheet FETs with air-gap inner and outer spacers, showing removal of the encapsulating layer, in accordance with an embodiment of the present invention.

Referring now to FIG. 11, a cross-sectional diagram of a step in forming nanosheet FETs with air-gap inner and outer spacers is shown. The encapsulating layer 806 as well as the expanded second inner spacer layer 702 is etched away. In an embodiment where both the encapsulating layer 806 and the second inner spacer layer 702 are formed from the same material (e.g., silicon dioxide), these structures can be removed with a single wet or dry chemical etch.

Figure 12:
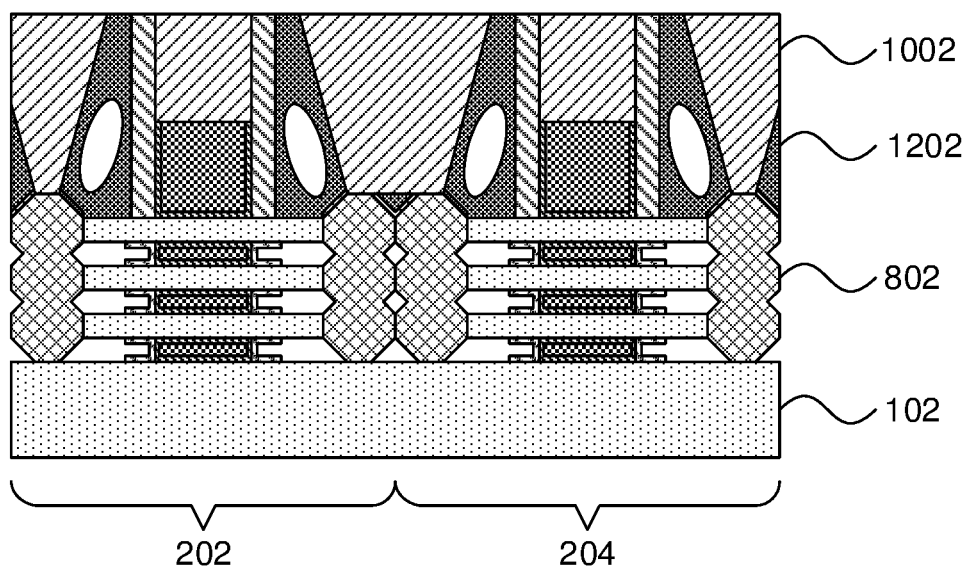
FIG. 12 is a cross sectional diagram of a step in forming nanosheet FETs with air-gap inner and outer spacers, showing formation of air-gap outer spacers, in accordance with an embodiment of the present invention.

Referring now to FIG. 12, a cross-sectional diagram of a step in forming nanosheet FETs with air-gap inner and outer spacers is shown. A new dielectric layer is deposited from a material that will pinch off (e.g., silicoboron carbonitride) and leave air gaps to form outer air-gap spacers 1202. The new dielectric material is deposited using any appropriate conformal deposition process including, e.g., CVD. In addition then to providing outer spacers with air gaps, inner air gaps 1204 also remain, such that these air gaps 1204 and the recessed first inner spacer layers 602 form inner air gap spacers.

It is to be understood that aspects of the present invention will be described in terms of a given illustrative architecture; however, other architectures, structures, substrate materials and process features and steps can be varied within the scope of aspects of the present invention.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present principles. The compounds with additional elements will be referred to herein as alloys.

Reference in the specification to "one embodiment" or "an embodiment", as well as other variations thereof, means that a particular feature, structure, characteristic, and so forth described in connection with the embodiment is included in at least one embodiment. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially re such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

Figure 13:
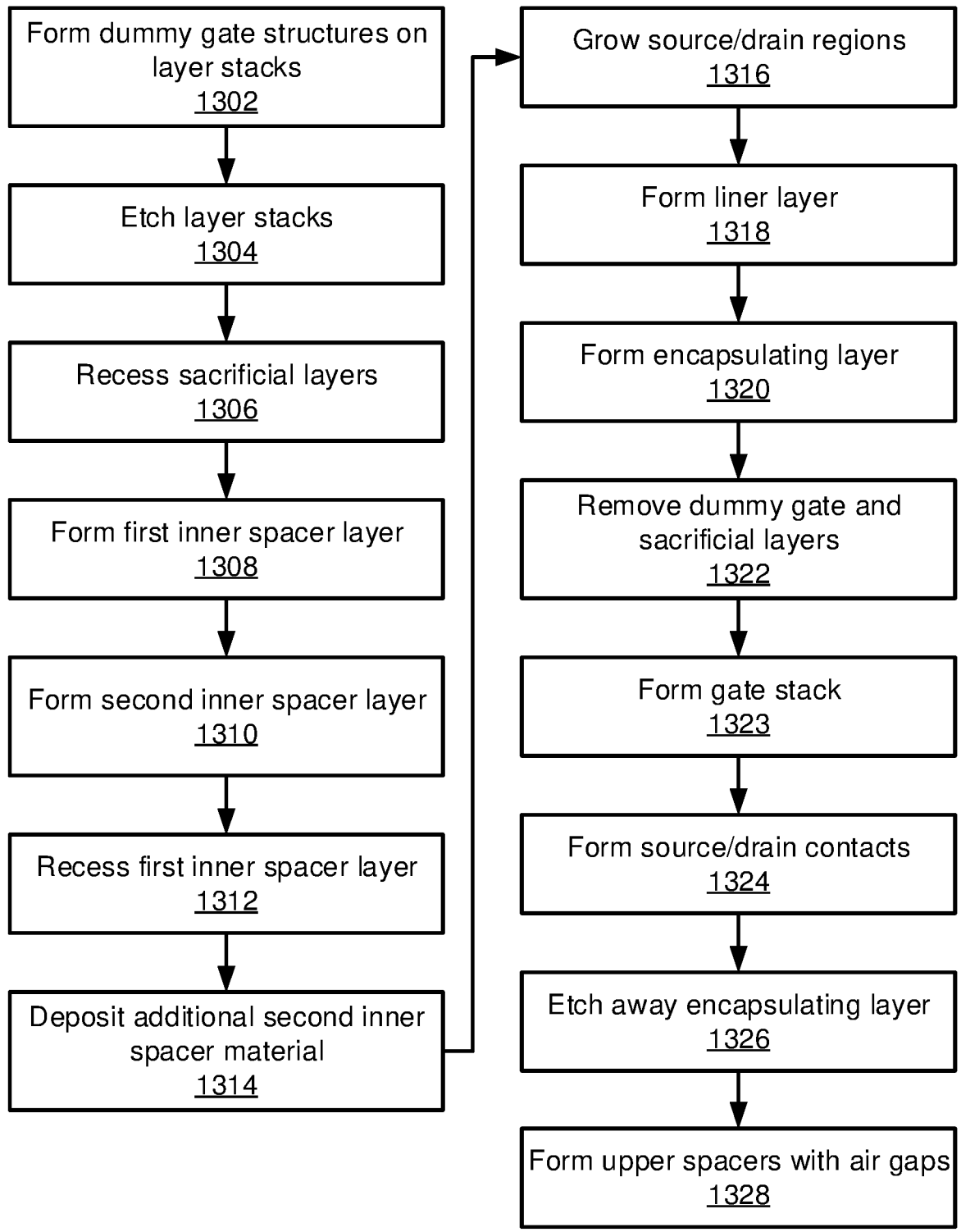
FIG. 13 is a block/flow diagram of a method of forming nanosheet FETs with air-gap inner and outer spacers in accordance with an embodiment of the present invention.

Referring now to FIG. 13, a method of forming nanosheet FETs with air-gap inner and outer spacers is shown. Block 1302 forms dummy gate structures on a stack of alternating sacrificial layers 104 and channel layers 106. The gate structures include a dummy gate 205, a first spacer layer 208, and a second spacer layer 210. It is specifically contemplated that the sacrificial layers 104 may be made of silicon germanium and that the channel layers 106 may be made of silicon, but other appropriate combinations of materials are also contemplated.

Block 1304 etches layer stacks 206 from the sacrificial layers 104 and channel layers 106, using the gate structures as a mask in an anisotropic etch. The etch removes material down to the substrate 102 and may be performed in alternating selective etches, with a final etch that stops on the semiconductor substrate 102.

Block 1306 recesses the sacrificial layers 104 relative to the channel layers 106 using a selective etch that preferentially removes material from the sacrificial layers. Block 1308 forms first inner spacer layer 402 in the gaps left by the recessed sacrificial layers 302. The first inner spacer layer 402 may be formed by conformally depositing, e.g., silicon nitride, and then anisotropically etching away the material from exposed surfaces. Block 1310 similarly forms second inner spacer layers 502 in gaps 404 left by the first inner spacer layers by conformally depositing, e.g., silicon dioxide, and then anisotropically etching away the material from exposed surfaces.

Block 1312 etches the first inner spacer layers 402 to form recessed first inner spacers 602. The etch of block 1312 may be any appropriate wet or dry chemical etch that selectively and isotropically removes material from the first inner spacer layers 402. Block 1314 then deposits additional second spacer layer material (e.g., silicon dioxide) to expand the second spacer layers 702 to fill the space left behind by recessing the first spacer layers 602.

Block 1316 epitaxially grows source/drain regions 802 from exposed sidewalls of the channel layers 106, with the source/drain regions 802 being formed from, e.g., in situ doped silicon. Block 1318 forms a liner 804 from, e.g., silicon nitride, over the source/drain regions 802 and then block 1320 deposits an encapsulating layer 806 from, e.g., silicon dioxide, using for example a CVD process or a spin-on flowable oxide process.

Block 1322 selectively etches away the dummy gate structures and the sacrificial layers 104. Block 1323 forms a gate stack, including a gate dielectric 902 formed from, e.g., a high-k dielectric material, and a gate 904 formed from, e.g., an appropriate conductive material. Block 1324 forms source and drain contacts 1002 by anisotropically etching through the encapsulating layer 806 and the liner layer 804 to reach the source/drain regions 802 and then depositing an appropriate conductor. Block 1326 etches away the encapsulating layer using a selective, isotropic, wet or dry chemical etch and block 1328 forms upper spacers 1202 by depositing, e.g., SiBCN that pinches off, preserving air gaps within the upper spacers 1202.

Having described preferred embodiments of air-gap spacers for gate-all-around nanosheet FETs (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

The invention claimed is:
1. A semiconductor device, comprising:
a stack of vertically arranged channel layers;
a gate stack formed above, between, and around the vertically arranged channel layers;
source and drain regions;
source and drain conductive contacts;
inner spacers between the vertically arranged channel layers, each comprising an inner air gap and a recessed layer formed from a first dielectric material, wherein the inner air gaps expose horizontal surfaces of edges of the vertically arranged channel layers; and
outer spacers between the gate stack and the source and drain conductive contacts, each comprising a second dielectric material that is pinched off to form an outer air gap.

2. The semiconductor device of claim 1, wherein the first dielectric material is silicon nitride and the second dielectric material is silicoboron carbonitride.

3. The semiconductor device of claim 1, wherein the recessed layers conform to surfaces of adjacent channel layers and of the gate stack and do not extend to respective side edges of the channel layers.

4. The semiconductor device of claim 1, wherein the recessed layers have a thickness between about 1 nm and about 2 nm.

5. The semiconductor device of claim 1, wherein the source and drain regions are grown from sidewalls of the vertically arranged channel layers.

6. The semiconductor device of claim 1, wherein each recessed layer includes a dielectric layer that contacts the gate stack and that is recessed relative to sidewalls of the vertically arranged channel layers.

7. The semiconductor device of claim 6, wherein each recessed layer is formed conformally on surfaces of the gate stack and the vertically arranged channel layers, such that each inner air gap includes a portion that is within a boundary established by a lateral extension of the recessed layer and a portion that is outside of the boundary established by the lateral extension of the recessed layer.

8. The semiconductor of claim 1, wherein the second dielectric material does not extend between the vertically arranged channel layers.

9. The semiconductor device of claim 1, wherein the second dielectric material is formed conformally on sides of the source and drain conductive contacts.

10. A semiconductor device, comprising:
a stack of vertically arranged channel layers;
a gate stack formed above, between, and around the vertically arranged channel layers;
source and drain regions grown from sidewalls of the vertically arranged channel layers;
source and drain conductive contacts;
inner spacers between the vertically arranged channel layers, each comprising an inner air gap and a recessed layer formed from a first dielectric material, wherein each recessed layer contacts the gate stack and is recessed relative to sidewalls of the vertically arranged channel layers, wherein the inner air gaps expose horizontal surfaces of edges of the vertically arranged channel layers; and
outer spacers between the gate stack and the source and drain conductive contacts, each comprising a second dielectric material that is pinched off to form an outer air gap.

11. The semiconductor device of claim 10, wherein the first dielectric material is silicon nitride and the second dielectric material is silicoboron carbonitride.

12. The semiconductor device of claim 10, wherein the recessed layers conform to surfaces of adjacent channel layers and of the gate stack and do not extend to respective side edges of the channel layers.

13. The semiconductor device of claim 10, wherein the recessed layers have a thickness between about 1 nm and about 2 nm.

14. The semiconductor device of claim 10, wherein each recessed layer is formed conformally on surfaces of the gate stack and the vertically arranged channel layers, such that each inner air gap includes a portion that is within a boundary established by a lateral extension of the recessed layer and a portion that is outside of the boundary established by the lateral extension of the recessed layer.

15. The semiconductor of claim 10, wherein the second dielectric material does not extend between the vertically arranged channel layers.

16. The semiconductor device of claim 10, wherein the second dielectric material is formed conformally on sides of the source and drain conductive contacts.

17. A semiconductor device, comprising:
a stack of vertically arranged channel layers;
a gate stack formed above, between, and around the vertically arranged channel layers;
source and drain regions grown from sidewalls of the vertically arranged channel layers;
source and drain conductive contacts;
inner spacers between the vertically arranged channel layers, each comprising an inner air gap and a recessed layer formed from silicon nitride, wherein each recessed layer is formed conformally on surfaces of the gate stack and the vertically arranged channel layers and is recessed relative to sidewalls of the vertically arranged channel layers, wherein the inner air gaps expose horizontal surfaces of edges of the vertically arranged channel layers; and
outer spacers between the gate stack and the source and drain conductive contacts, each comprising a silicoboron carbonitride layer that is formed conformally on sides of the source and drain conductive contacts and is pinched off to form an outer air gap.

18. The semiconductor device of claim 17, wherein the recessed layers conform to surfaces of adjacent channel layers and of the gate stack and do not extend to respective side edges of the channel layers.

19. The semiconductor device of claim 17, wherein the recessed layers have a thickness between about 1 nm and about 2 nm.

20. The semiconductor device of claim 17, wherein the inner air gap includes a portion that is within a boundary established by a lateral extension of the recessed layer and a portion that is outside of the boundary established by the lateral extension of the recessed layer.

* * * * *